United States Patent
Johnson et al.

(10) Patent No.: US 6,388,600 B1
(45) Date of Patent: May 14, 2002

(54) ASYNCHRONOUS SUPERCONDUCTOR SERIAL MULTIPLY-ACCUMULATOR

(75) Inventors: Mark W. Johnson, La Canada Flintridge; Dale J. Durand, Irvine, both of CA (US)

(73) Assignee: TRW Inc., Redondo Beach, CA (US)

(*) Notice: Subject to any disclaimer, the term of this patent is extended or adjusted under 35 U.S.C. 154(b) by 0 days.

(21) Appl. No.: 09/711,322

(22) Filed: Nov. 13, 2000

(51) Int. Cl.[7] .................................................. H03M 1/12
(52) U.S. Cl. ........................................ 341/155; 341/133
(58) Field of Search ................................ 341/155, 133, 341/157

(56) References Cited

U.S. PATENT DOCUMENTS

| | | | |
|---|---|---|---|
| 4,062,005 A | * 12/1977 | Freed et al. ................ | 341/112 |
| 4,910,695 A | * 3/1990 | Gale et al. .................. | 364/604 |
| 6,127,960 A | * 10/2000 | Silver et al. ................ | 341/157 |

OTHER PUBLICATIONS

Quetin P. Herr, et al., "Design and Low Speed Testing of a Four–Bit RSFQ Multiplier–Accumulator", 1997, pp. 3168–3171.
K. K. Likharev and V. K. Semenov, "RSFQ Logic–Memory Family: A New Josephson–Junction Technology for Sub–Terahertz–Clock–Frequency Digital Systems", 1991, pp. 3–28.

\* cited by examiner

*Primary Examiner*—Peguy Jeanpierre
(74) *Attorney, Agent, or Firm*—Harness, Dickey & Pierce, P.L.C.

(57) ABSTRACT

An oscillator/multiply-accumulator AID converter (100) which simultaneously provides frequency downconversion, band pass filtering and analog-to-digital conversion of an analog signal, where the analog signal includes a carrier wave modulated with information by any known modulation technique. The converter (100) uses a superconducting, Josephson single flux quantum circuit operating as a voltage controlled oscillator (102). The voltage controlled oscillator (102) receives the analog signal to be converted, and generates a series of sharp, high frequency pulses based on the characteristics of the carrier signal. The series of pulses are applied to a gate circuit (104) that either passes or blocks the pulses depending on a gate control signal (103). When the pulses are passed by the gate circuit (104), a multiply-accumulator (106) multiplies the pulse by a binary coefficient (109) and accumulates the products (111) resulting from the multiplication during a predetermined time period. The predetermined time period includes at least one sampling period. Each sample is multiplied by a different weight and their products (111) are accumulated. This operation eliminates the DC response, and leads to an improved frequency response.

23 Claims, 4 Drawing Sheets

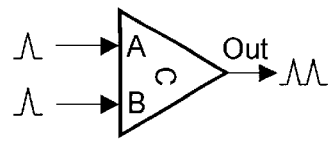
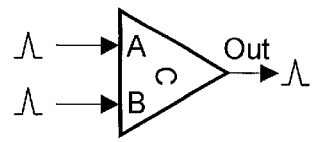
Fig. 7a    Fig. 7b
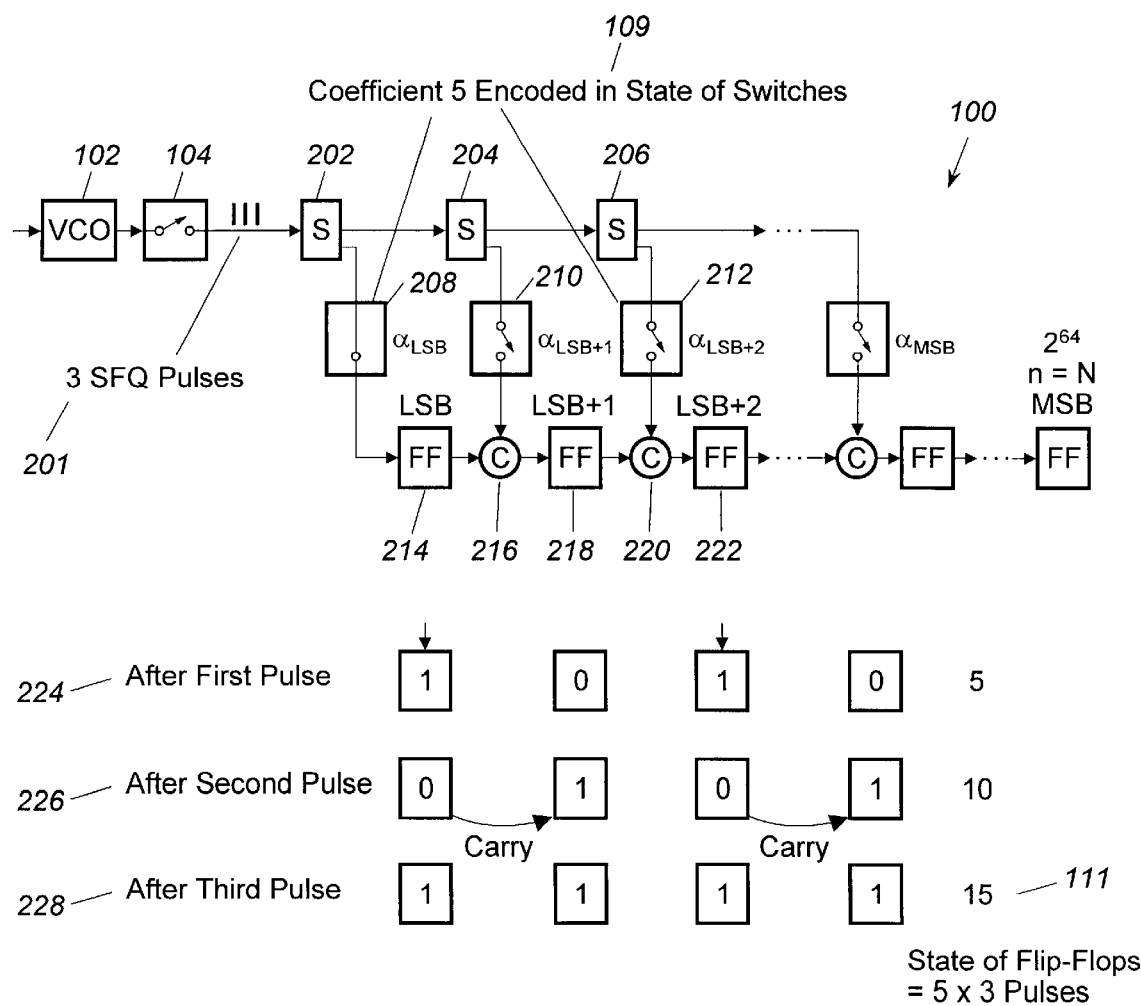
Fig. 8

ASYNCHRONOUS SUPERCONDUCTOR SERIAL MULTIPLY-ACCUMULATOR

CROSS-REFERENCE TO RELATED APPLICATIONS AND PATENTS

This application is related to the following U.S. patent and pending patent applications, which are assigned to the same assignee as the present invention and which are herein incorporated by reference:

1. U.S. Pat. No. 5,942,997, issued Aug. 24, 1999, entitled "Correlated Superconductor Single Flux Analog-to-Digital Converter";

2. U.S. Pat. No. 6,127,960, issued Oct. 3, 2000, entitled "Direct Digital Downconverter based on an Oscillator/Counter Analog-to-Digital Converter"; and 3. U.S. Pat. No. 6,225,936, filed Jun. 4, 1999, entitled "Direct Digital Downconverter and Method for converting an Analog Signal to a Digital Signal".

BACKGROUND OF THE INVENTION

1. Field of the Invention

This invention relates generally to a system that converts an analog signal to a digital signal having a lower frequency representation and, more particularly, to an oscillator/multiply-accumulator analog-to-digital converter that simultaneously performs frequency downconversion, band pass filtering and analog-to-digital conversion of an analog signal using a superconducting, Josephson single flux quantum circuit to extract information from a modulated carrier wave in a communications system.

2. Discussion of the Related Art

Various communication systems, such as cellular telephone systems, radar systems, etc., transmit information by modulating the information to be transmitted onto a high frequency carrier signal. Different modulation techniques are known in the art, such as amplitude modulation, frequency modulation, phase modulation, etc., that impress information onto a carrier signal to be transmitted. The carrier signal is received by a receiver that removes the carrier signal to separate and decipher the transmitted information. To remove the carrier signal, state of the art receivers typically include an analog mixer or a frequency downconverter that multiplies the received carrier signal with a local oscillator signal to remove the carrier signal and convert the signal to a lower intermediate or baseband frequency. The downconverted frequency signal is then filtered by a pass band filter that passes the frequencies of interest including the extracted information. The filtered signal is then converted to a digital signal by an analog-to-digital (A/D) converter to provide a digital representation of the information that is subsequently processed by a digital microprocessor. This process for extracting information from a carrier signal is well known to those skilled in the art.

Although this type of circuit is successful for extracting transmitted information from a carrier signal, improvements can be made. For example, because these types of communication systems first mix the analog carrier signal to provide the downconversion and then filter the downconverted analog signal before the signal is converted to a digital representation, noise from the various amplifiers and other electrical components in the downconverter and filter decreases the signal-to-noise ratio of the signal and thus degrades the receiver performance. Additionally, it takes several discrete electrical circuits to perform the mixing, filtering and analog-to-digital conversion. Therefore, the communication electronics could benefit from decreased complexity, part count, and power consumption of these circuits.

Alternately, frequency downconversion can be performed digitally. A straight-forward method of digitally performing frequency downconversion is to digitize the carrier signal fast enough to record the carrier directly. In principle, the information on the carrier signal can be extracted from the digital data stream using fast Fourier transform (FFT) routines and other digital signal processing techniques. This type of method stresses the performance of the A/D converter, because it needs to sample the signal fast enough to record the carrier while maintaining a very high dynamic range to avoid degrading the signal and the information bandwidth. Because of this requirement, these systems would require an A/D converter performance which cannot yet be realized in the state of the art.

A second digital frequency downconversion technique, presently used to effectively produce frequency downconversion, is known as intermediate frequency (IF) sampling. In IF sampling, a narrow band pass analog filter centered at the carrier frequency, precedes a standard non-integrating A/D converter. The A/D converter is intentionally operated well below the Nyquist condition for the input signal, generating an alias of the signal which effectively converts the frequency of the information. The presence of the narrow band pass filter removes the ambiguity in the original signal frequency usually introduced by aliasing in A/D conversion. This technique is fundamentally different from the present invention. IF sampling is based on instantaneous samples of the signal where the sampling is done on a time scale very short compared to one period of the carrier signal. The present invention is based on an integration of the signal over a time longer than a few periods of the carrier signal. This difference leads to significantly different requirements for the analog signal filter and much greater flexibility of the present invention.

Oscillator/counter A/D converters that use superconducting, Josephson single flux quantum (SFQ) circuits for converting an analog signal to a digital signal are disclosed in U.S. Pat. No. 5,942,997. A general depiction of an oscillator/counter A/D converter 10 of the type disclosed in Pat. No. 5,942,997 is shown in FIG. 1. The converter 10 includes a voltage controlled oscillator (VCO) 12, a digital gate circuit 14 and a digital pulse counter circuit 16. Each of the VCO 12, the gate circuit 14 and the counter circuit 16 are general representations of known electrical circuits that perform the functions described herein. The analog carrier signal is received by an antenna (not shown) and is applied to the VCO 12. The VCO 12 converts the analog signal to a series of high frequency SFQ pulses having a pulse frequency proportional to the voltage potential of the analog signal applied to the VCO 12. The VCO 12 uses multiple Josephson Junctions within a direct current superconducting quantum interface device (SQUID) to convert the analog signal to the series of SFQ pulses. The repetition rate of the pulses from the VCO 12 is dependent on the frequency and amplitude of the carrier signal and the information modulated thereon. In other words, the VCO 12 will output the pulses at a certain pulse rate depending on the characteristics of the modulated carrier signal. Typically, the pulse rate of the output of the VCO 12 will be greater than the frequency of the carrier signal.

A control signal is applied to the gate circuit 14 such that when the control signal is high, the gate circuit 14 will pass the pulses from the VCO 12. When the gate circuit 14 passes the pulses from the VCO 12, the counter circuit 16 accumulates and counts the pulses to give a digital representation of the analog input signal to the VCO 12. In one embodiment, the counter circuit 16 is a single flux quantum counter comprising a chain of flip-flops which operate asynchronously to accumulate the total number of pulses from the VCO 12. The total count of the pulses from the VCO 12 during the time that the control signal to the gate circuit 14 is high is the digital representation of the analog signal integrated over the sample time. The oscillator/counter A/D converter disclosed in U.S. Pat. No. 5,942,997 resets the counter circuit 16 to zero before each sample time. In other words, each time the control signal applied to the gate circuit 14 goes low, the counter circuit 16 is reset so that the sample period is equal to the period of the gate control pulses.

Attempts have been made to improve the control of the oscillator/counter A/D converter of the '997 patent. These attempts are discussed in U.S. Pat. No. 6,127,960, U.S. patent application Ser. No. 09/326,073, filed Jun. 4, 1999, referenced above.

As is best illustrated in FIGS. 1 and 2, the '960 patent discloses the analog input signal 20 being input into the VCO 12, where it is converted into a series of sharp, high frequency pulses based on the characteristics of the carrier signal. The series of pulses are applied to a gate circuit 14 that either passes or blocks the pulses depending on whether the gate control signal is high 22 or low 24. When the pulses are passed by the gate circuit 14, the counter circuit 16 accumulates the pulses during a sampling period T. The sampling period T covers a range of gate control pulses 22 and 24 so that the accumulation of pulses defines consecutive on/off periods of the gate control signal. Each time the gate control signal passes the pulses from the VCO 12, the converter 10 effectively performs a one bit multiplication that provides the frequency conversion.

The '073 patent application discloses an improved converter 30 illustrated in FIG. 3. An analog input signal 40 is sent through a band pass filter 32 and is received by a VCO 34. The VCO 34 generates a series of sharp, high frequency pulses based on the characteristics of the carrier signal. The series of pulses are applied to a gate circuit 36 that alternately connects the pulses to an increment port 50 and a decrement port 52 of a bi-directional algebraic SFQ pulse counter 38, in response to signals provided by a gate control signal 42. The counter circuit 38 accumulates the pulses during a sampling period which covers a range of gate control pulses, so that the accumulation of pulses includes consecutive increment/decrement periods of the gate control signal 42. Incrementing and decrementing pulses is equivalent to accumulating the product of the SFQ pulse train 54 and one and minus one, respectively.

Although these types of systems are successful for converting an analog signal to a digital signal, improvements can be made to improve the frequency response. Therefore, it is an object of the present invention to provide an analog-to-digital converter which improves the frequency responses so as to eliminate the periodic responses that are out of band and eliminate the DC response.

SUMMARY OF THE INVENTION

In accordance with the teachings of the present invention, an oscillator/multiply-accumulator A/D converter is disclosed that simultaneously provides frequency downconversion, band pass filtering and analog-to-digital conversion of an analog signal, where the analog signal includes a carrier wave modulated with information by any known modulation technique. In one embodiment, the converter uses a superconducting, Josephson Junction single flux quantum circuit operating as a voltage controlled oscillator (VCO). The VCO receives the analog signal to be converted, and generates a series of sharp, high frequency pulses having a repetition frequency based on the characteristics of the carrier signal. The series of pulses are applied to a gate circuit that either passes or blocks the pulses depending on whether a gate control signal is high or low. When the pulses are passed by the gate circuit, a multiply-accumulator multiplies the series of pulses by a binary coefficient transmitted from a memory and accumulates the product for a predetermined period of time. The multiply-accumulator improves the frequency response and eliminates the periodic responses that are out of band, and eliminates the DC response. This operation produces an analog-to digital conversion, frequency conversion, and a well defined frequency band pass filter function.

Additional objects, advantages, and features of the present invention will become apparent from the following description and appended claims, taken in conjunction with the accompanying drawings.

BRIEF DESCRIPTION OF THE DRAWINGS

FIGS. 7A and 7B are diagrams illustrating the timing logic of a combiner gate adapted for use in the multiply-accumulator shown in FIG. 6; and FIG. 8 is a diagram depicting an exemplary multiplication and accumulation in accordance with the teachings of the present invention.

DETAILED DESCRIPTION OF THE PREFERRED EMBODIMENT

The following description of the preferred embodiments, directed to an oscillator/multiply-accumulator A/D converter that performs frequency downconversion, is merely exemplary in nature, and is in no way intended to limit the invention or its application or uses.

Figure 1:
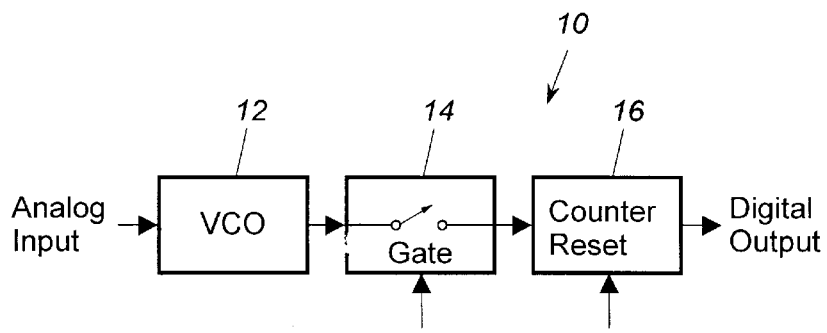
FIG. 1 is a block schematic diagram of an oscillator/counter A/D converter known in the art.
Figure 2:
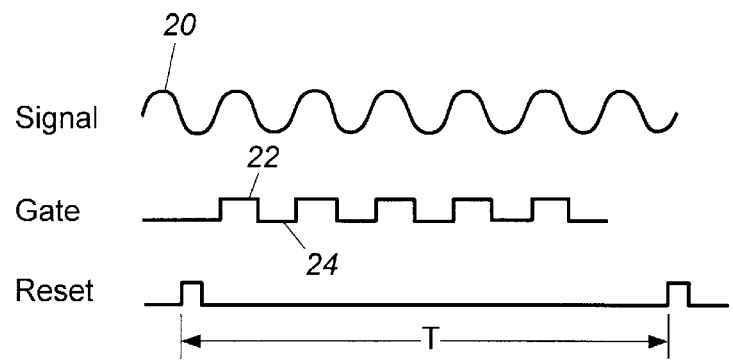
FIG. 2 is a timing diagram for controlling the converter shown in FIG. 1 that is known in the art.
Figure 3:
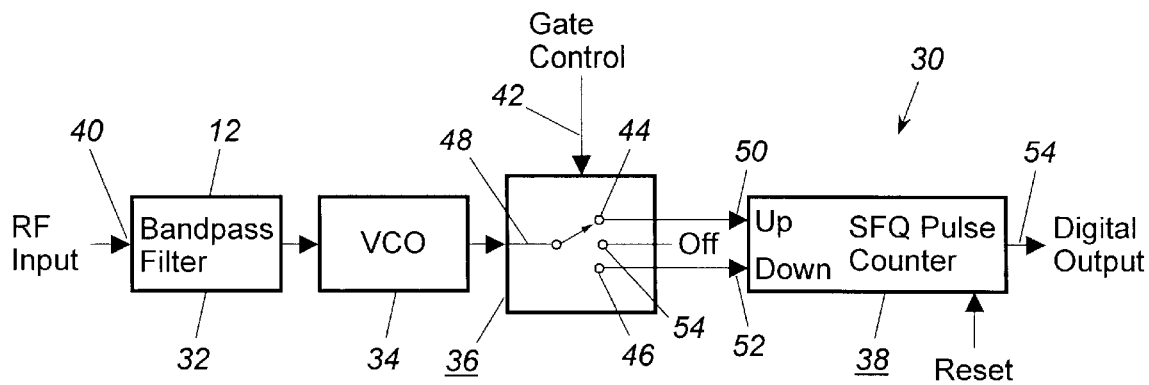
FIG. 3 is a block schematic diagram of an oscillator/counter analog-to-digital converter that includes an up-down counter.
Figure 4:
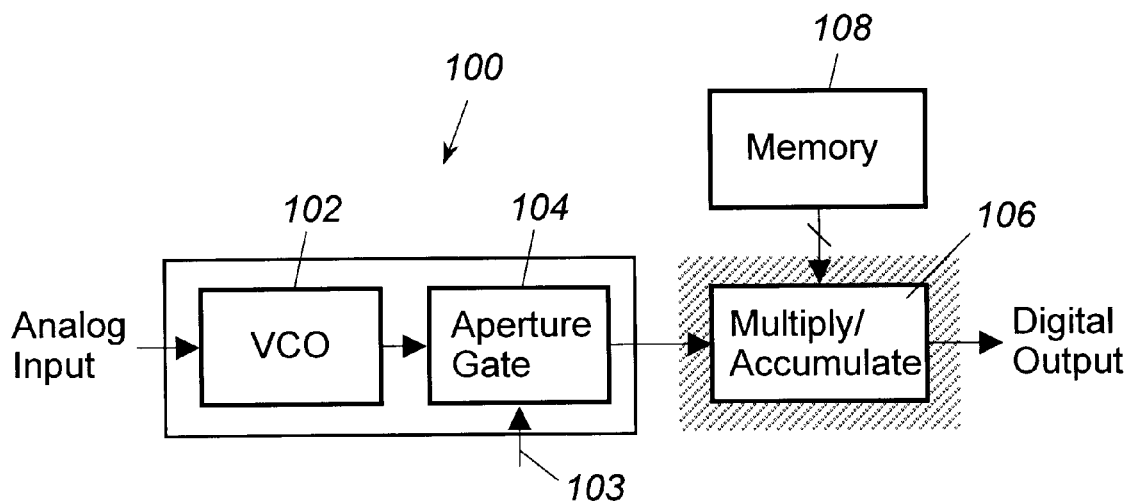
FIG. 4 is a block diagram of an oscillator/multiply-accumulator analog-to-digital converter, according to an embodiment of the present invention.

Referring to FIG. 4 of the drawings, an analog-to-digital (A/D) converter 100 is shown that provides a digital representation of an analog signal. The converter 100 includes a voltage controlled oscillator (VCO) 102 which receives an analog input signal. The VCO 102 is a superconducting quantum interface device which includes a multiple Josephson Junctions.

The VCO 102 generates a series of high frequency, single flux quantum (SFQ) pulses that are asynchronous. The series of SFQ pulses are transmitted to an aperture gate 104, which is controlled by a gate control signal 103. The aperture gate 104 passes the SFQ pulses through the gate 104 when it is enabled by the gate control signal 103, and blocks the pulses when it is disabled by the gate control signal 103. The aperture gate 104 is held open for a predetermined period of time. The number of pulses that pass through the aperture gate 104 during the predetermined period of time is proportional to the frequency of the SFQ pulses transmitted from the VCO 102, which is directly proportional to the voltage across the VCO. The output from the aperture ate 104, or samples 105, are then transmitted to a multiply-accumulator 106. The multiply-accumulator 106 generates a digital representation of the analog input signal that has been frequency converted and band pass filtered.

Figure 5:
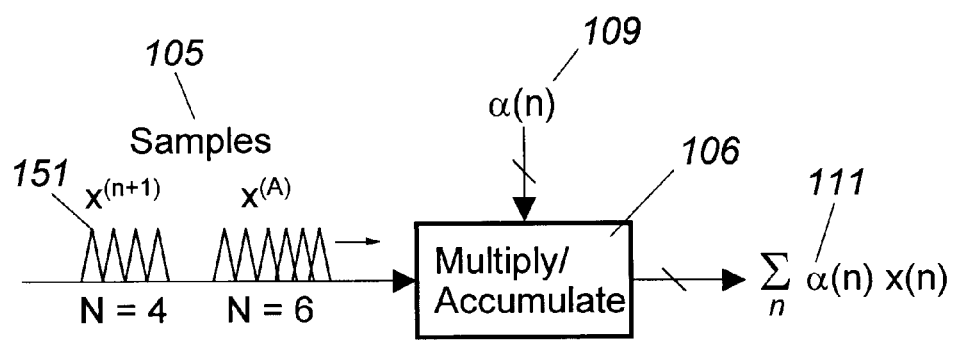
FIG. 5 is a block diagram showing the input and output signals of the multiply-accumulator shown in FIG. 4.

Referring to FIG. 5 of the drawings, the multiply-accumulator 106 receives a binary coefficient 109 from a memory 108 (FIG. 4) and a series of samples, or asynchronous pulse trains 105, from the aperture gate 104 (FIG. 4). The multiply-accumulator 106 multiplies each of the pulses 151 in the pulse trains 105 independently relative to the others in one sampling period by the binary coefficient 109 and accumulates their products 111. When the multiply-accumulator 106 receives the next sample, or the next pulse train 105, a different binary coefficient may be used to multiply the SFQ pulse 151 of the pulse train 105 with a different weight. The products of the subsequent pulse trains are accumulated with the products of the first pulse train 105. The accumulated products 111 of all of the pulse trains 105 from the aperture gate 104 during a predetermined period of time define a digital representation of the analog input signal. The multiply-accumulator 106 of the present invention is equivalent to a finite impulse response (FIR) digital filter which multiplies each of the samples with a different weight. The use of multiply-accumulator 106 in the converter 100 leads to an improved frequency response that eliminates periodic responses which are out of band, and eliminates the DC response.

Figure 6:
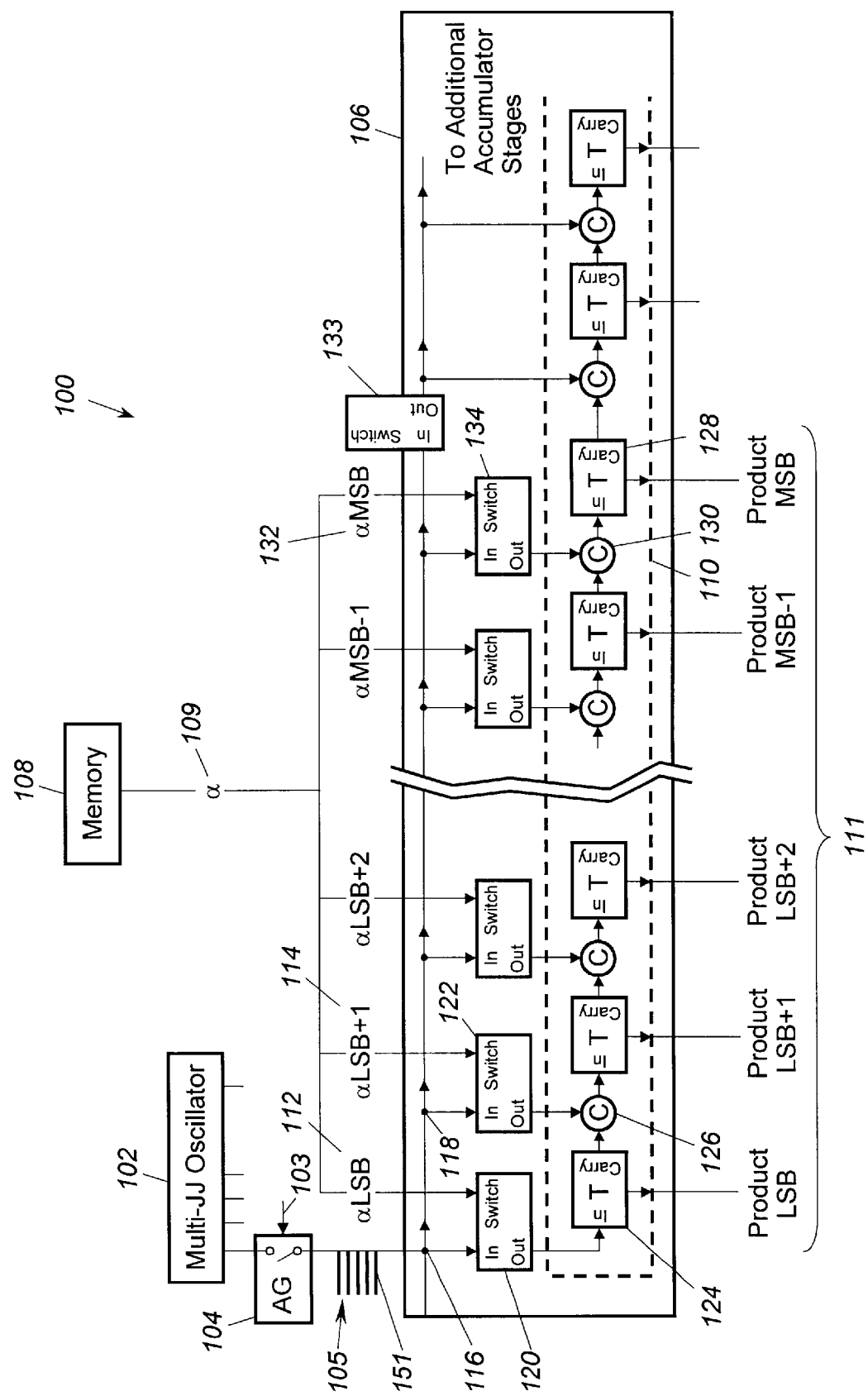
FIG. 6 is a detailed block diagram of the multiply-accumulator shown in FIG. 5, according to an embodiment of the present invention.

As is best illustrated in FIG. 6, the multiply-accumulator 106 includes a plurality of splitters 116 and 118, a plurality of non-destructive read out (NDRO) switch gates 120, 122 and 134, and a binary ripple counter 110 that is connected to the switch gates 120, 122 and 134. Each of the switch gates 120, 122 and 134 receive two input signals which are the binary coefficient 109 (FIG. 5) and the asynchronous pulse train 105. Each bit 112, 114 and 132 of binary coefficient 109 is transmitted from the memory 108 to each of the switch gates 120, 122 and 134 in a parallel manner. The least significant bit (LSB) 112 of the binary coefficient 109 is transmitted to the LSB switch gate 120, and the most significant bit (MSB) 132 of the binary coefficient 109 is transmitted to the MSB switch gate 134. Each of the switch gates 120, 122 and 134 are enabled independently of the others when their associated bits 112, 114 and 132 of the binary coefficient 109 are high, and the switch gate 120, 122 and 134 are disabled when their associated bits 112, 114 and 132 of the binary coefficient 109 are low.

The other input signal of the switch gates 120,122 and 134 is the asynchronous pulse train 105. As described above, the asynchronous pulse train 105 includes the series of SFQ pulses 151 which represent a decimal number. In other words, if there are five pulses 151 in one pulse train 105 as shown in FIG. 5, the pulse train 105 represents a decimal number five. The pulse train 105 is generated by the VCO 102 and is alternately blocked or passed by the aperture gate 104. The pulse train 105 passes through the aperture gate 104 when the gate 104 is enabled by the gate control signal 103.

The pulse train 105 is transmitted to the plurality of switch gates 120, 122 and 134 in a serial manner by transmitting each pulse 151 of the pulse train 105 to splitters 116 and 118. When the pulse 151 is received by the first splitter 116, it makes a copy of the pulse 151. The copy of the pulse 151 is then transmitted to the associated switch gate 120 and the original pulse 151 moves to the next splitter 118. The pulse 151 is copied again and passed onto subsequent splitters until all of the switch gates get a copy of the pulse 151. When both inputs 151 and 109 are received by the switch gates 120, 122 and 134, the pulse 151 is passed through the open switch gates 120, 122 and 134 that are enabled by high bits of the binary coefficient 109.

The multiply-accumulator 106 also includes a sign bit NDRO switch gate 133 which determines whether the binary coefficient 109 is to be added into or subtracted from the multiply-accumulator 106. The sign bit NDRO switch gate 133 receives two input signals, a sign bit signal 132 and the pulse 151 of the pulse train 105. The high sign bit signal 132 enables the sign bit NDRO switch gate 133 causing the product of the binary coefficient 109 and the pulse 151 to be subtracted from the multiply-accumulator 106. The low sign bit signal 132 disables the switch gate 133 causing the product to be added to the multiply-accumulator 106.

Outputs from each of the switch gates 120, 122, and 134 are then transmitted to the binary ripple counter 110. The binary ripple counter 110 includes a plurality of toggle flip-flops 124, 128 and a plurality of confluence gates 126, 130 that function as combiners. Each of the confluence gates 126,130 are disposed between two toggle flip-flops 124,128. The LSB switch gate 120 transmits its output to a LSB toggle flip-flop 124, and LSB+1 through MSB switch gates 122,134 transmit their outputs to their associated confluence gates 126 and 130. In the preferred embodiment of the present invention, a conventional OR gate is used as the confluence gate 126, 130 which combines two inputs from the associated toggle flip-flop 124 and the associated switch gate 122, and forwards them as a single output to the subsequent flip flop. The confluence gate used in this embodiment always transmits a number of pulses equal to the total number of pulses incident at its two input ports labeled A and B in FIG. 7A. A possible incorrect operating mode as shown in FIG. 7B where two incident pulses arrive essentially at the same time and only one pulse is transmitted is avoided in the design of the confluence gate.

In the special case of a digital filter coefficient, $\alpha$, that is equal to unity only the LSB switch 120 is set to pass pulses. In this case all other switches are set to block pulses. For this special case coefficient, the binary ripple counter 110 functions as follows. The toggle flip-flop 124, has two states, 0 and 1. When the first pulse 151 is received by the binary ripple counter 110, the toggle flip-flop 124 switches from its 0 state to 1 state. When the toggle flip flop 124 receives the second pulse 151, it switches from the 1 state to the 0 state and generates a carry signal which is output to the first confluence gate 126, which forwards the pulse to the next toggle flip-flop. The binary ripple counter 110 thus functions as an accumulator with the number of input pulses represented in binary form by the states of the flip flop gates 124 through 128.

In the general case of an arbitrary binary filter coefficient, a, 109 the multiplier/accumulator 106 adds the algebraic product of the coefficient and the number of pulses at the input 105 to the previous contents of the binary ripple counter. Multiplication and accumulation of the products is accomplished simultaneously in the multiplier/accumulator of the present invention 106. The toggle flip flops 142 through 128 and those beyond 128 are reset to zero before a new accumulation. Gated input pulses 105 and binary coefficients 109 are input to the multiplier/accumulator 106 for a desired number of samples. After the desired number of samples have been accumulated, the accumulation of products is represented by the flip flop output lines 111 and the output lines of those flip flops 128 in the binary ripple counter. The accumulated product is read out and the flip flops are reset to zero readying them for the next accumulation. The accumulated products, taken as a whole, produce a digital representation of the input signal that has been digitally filtered. Depending of the design of the digital coefficients, this filter can produce a low pass, band pass, high pass, or more complicated frequency response. Frequency translation is accomplished through proper design of the VCO pulse gate timing, the number of filter coefficients and the number of multiplier/accumulators used in one system.

Referring to FIG. 8, an example of how the multiply-accumulator 106 multiplies a sample of the SFQ pulses 105 by the binary coefficient 109 and accumulates the product 111 is illustrated. The VCO 102 receives an analog signal and generates an asynchronous pulse train. The pulse train is transmitted to the aperture gate and is alternately blocked and passed to generate a sample, or a pulse train 105. In this example, the pulse train 105 contains three SFQ pulses 201 and the binary coefficient 109 is 101 which represents a decimal number five.

Each of the three consecutive SFQ pulses 201 are then independently transmitted to the splitters 202, 204 and 206. When one of the three SFQ pulses 201, is received by the LSB splitter 202, the LSB splitter 202 makes a copy of the pulse. A copy of each pulse 201 is sent to the corresponding LSB switch gate 208 and the original pulse is sent to the next splitter 204. Each pulse is copied again by the next splitter 204 and transmitted to the following splitters 206 until the pulses reach the sign bit gate 166.

In this example, a binary coefficient 101 is used. The first (LSB) 208 and third (LSB+2) 212 switch gates are enabled by the high LSB and LSB+2 bits of the binary coefficient 109, and the other switch gates including the LSB+1 switch gate 210 are disabled by the low bits including the LSB+1 bit of the binary coefficient. The enabled switch gates 208 and 212 pass the SFQ pulses 201 and the disabled switch gates 210 block the pulses. Thus, the LSB flip flop gate 214 and the LSB+2 combiner gate 220 each receive the three SFQ pulses 201.

The boxes at the bottom of FIG. 8 containing numbers "1" or "0" show the time progression of the states of the four flip flops directly above the four columns of boxes 224, 226, and 228.

Upon receiving the first pulse, the LSB flip-flop gate 214 changes its state from 0 to 1. The LSB+2 combiner gate 220 forwards the pulse to the LSB+2 flip-flop gate 222 which then changes its state from 0 to 1. After the first pulse, the state is shown in the first row of boxes, 224, which are binary coded representation of a decimal number 5.

When the second pulse of the SFQ pulses 201 is transmitted, the second pulse is then distributed to each of the switch gates 208, 210 and 212. The second pulse only passes through the enabled LSB 208 and LSB+2 212 switch gates because the same binary coefficient 109 is used. Again, the LSB flip-flop gate 214 and the LSB+2 combiner gate 220 receive the second pulse.

When the LSB flip-flop gate 214 receives the second pulse, the flip-flop 214 switches its state from 1 to 0 and transmits a carry signal to the LSB+1 combiner gate 216. When the LSB+1 combiner gate 216 receives the carry signal, the LSB+1 combines gate 216 forwards the pulse to the LSB+1 flip-flop gate 218 which changes its state from 0 to 1. When the LSB+2 combiner gate 220 receives the second pulse, the LSB+2 combiner gate 220 forwards the pulse to the LSB+2 flip-flop gate 222. Upon receiving the second pulse, the LSB+2 flip-flop gate 222 changes its state from 1 to 0 and generates a carry which is transmitted to the LSB+3 combiner gate. The LSB+3 combiner gate forwards this pulse to the LSB+3 flip-flop gate, and the LSB+3 flip-flop gate subsequently changes its state from 0 to 1.

After the second pulse, the state of each of the flip-flop gates 214, 218, and 222 and the LSB+3 flip-flop (not shown) are 0101 which is the binary coded representation of the decimal number 10.

After the second pulse is accumulated, the third pulse of the SFQ pulses 201 is transmitted and distributed to each of the switch gates 208, 210, and 212. Again, only the LSB 208 and LSB+2 212 switch gates pass the third pulse, which then output to the LSB flip-flop gate 214 and LSB+2 combiner gate 220. When the LSB flip-flop gate 214 receives the third pulse, the LSB flip-flop gate 214 switches its state from 0 to 1 and no carry is generated. When the LSB+2 combiner gate 220 receives the third pulse, the LSB+2 combiner gate 220 forwards the pulse to the LSB+2 flip-flop gate 222 which changes its state from 0 to 1.

The combination of outputs from each of the flip-flop gates 214, 218 and 222 and the LSB+3 flip-flop, or the final products 111 are 1111 which are binary coded representation of a decimal number 15. Even after the completion of the multiplication and accumulation of the first sample of the first set of the SFQ pulses 201, the series of flip-flop gates 214, 218 and 222 are not reset but remain at their current state, so that the multiply-accumulator 106 can accumulate more than one sample.

The accumulation of algebraic products of the digital filter coefficients and the samples from the gated VCO performs a digital filter function.

The above described invention provides an improved technique for simultaneously performing analog-to-digital conversion, frequency conversion, and band pass filtering which leads to a less DC response than is known in the prior art. The system described herein has an extended use in many types of communication and radar systems, and provides significant improvements over the known systems.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A system for converting an analog input signal to a digital output signal, the system comprising:

an oscillator circuit receiving the analog input signal and converting the analog input signal to a series of oscillator pulses;

a digital gate coupled to the oscillator circuit for alternately blocking and passing the series of oscillator pulses to generate gate output pulses in response to a gate control signal; and a multiplier-accumulator responsive to the gate output pulses from the digital gate and a binary coefficient from a memory, said multiplier-accumulator multiplying each of the gate output pulses by the binary coefficient and accumulating each of the multiplied pulses to generate the digital output signal.

2. The system according to claim 1 wherein the multiplier-accumulator includes a plurality of switches that receive the binary coefficient from the memory and a copy of the gate output pulse from the digital gate, and wherein each of the switches are independently enabled relative to each other when the associated bit of the binary coefficient is high, the enabled switches transmitting the gate output pulse when the associated switch is enabled.

3. The system according to claim 2 wherein the multiplier-accumulator further includes a splitter for copying the gate output pulses and loading each of the switches with a copy of the gate output pulses.

4. The system according to claim 2 wherein the plurality of switches are Non-Destructive Read Out (NDRO) gates.

5. The system according to claim 2 wherein the multiplier-accumulator includes a binary ripple counter that receives the transmitted pulses from the switches, the binary ripple counter generating the digital output by multiplying each of the transmitted pulses by the binary coefficient and accumulating each of the multiplied pulses.

6. The system according to claim 5 wherein the binary ripple counter further comprising:

a plurality of registers for counting each of the transmitted output pulses from the switches and generating a product, and a plurality of combiners for generating a carry bit, a first one of the registers receiving an input from one of the switches and the other registers receiving inputs from the associated combiner, each of the combiners receiving transmitted pulses from an associated switch and the product from an associated register, wherein the combination of products from each of the registers define the digital output signal.

7. The system according to claim 6 wherein the plurality of registers are toggle flip-flops.

8. The system according to claim 6 wherein the plurality of combiners are asynchronous OR gates.

9. The system according to claim 1 wherein the oscillator circuit is a superconducting quantum interface device that includes multiple Josephson Junctions.

10. The system according to claim 1 wherein the analog signal has a carrier wave frequency, and the gate control signal has a frequency substantially the same as the carrier wave frequency.

11. The system according to claim 1 wherein the digital output signal is a digital representation of the analog input signal that has been frequency converted and band pass filtered.

12. A system for converting an analog input signal to a digital output signal where the digital output signal is a frequency conversion representation of the input signal, the system comprising:

an oscillator circuit receiving the analog input signal and converting the analog input signal to a series of oscillator pulses;

a digital gate coupled to the oscillator circuit for alternately blocking and passing the series of pulses to generate gate output pulses in response to a gate control signal;

a plurality of switches receiving a subsequent pulse of the gate output pulses independently relative to the other pulses from the digital gate and a binary coefficient from a memory, each of the switches being enabled depending on the associated binary coefficient, the enabled switches transmitting one of the gate output pulses independently from the others when the associated switch is enabled, and a binary ripple counter receiving the transmitted gate pulses from the switches, wherein the binary ripple counter generates the digital output signal by multiplying each of the transmitted gate pulses by the binary coefficient and accumulating each of the multiplied pulses, wherein the series of switches and the binary ripple counter define a multiply-accumulator which repeats the multiplication of each of the gate output pulses by the binary coefficient and the accumulation of the multiplied products for a predetermined sampling period.

13. The system according to claim 12 wherein the binary ripple counter includes a plurality of toggle flip-flop gates for counting each of the transmitted output pulses from the switches and generating a product, and a plurality of asynchronous OR gates for generating a carry bit, a first one of the toggle flip-flops receiving an input from one of the switches and the other toggle flip-flops receiving inputs from the associated OR gate, each of the OR gates receiving transmitted pulses from an associated switch and the product from an associated toggle flip-flops, wherein the combination of products from each of the toggle flip-flops define the digital output signal.

14. The system according to claim 12 wherein the multiply-accumulator further includes a splitter for copying the gate output pulses and loading each of the switches with a copy of the gate output pulses.

15. The system according to claim 12 wherein the digital output signal is a digital representation of the analog input signal that has been frequency converted and band pass filtered.

16. A method of converting an analog input signal to a digital output signal, said method comprising the steps of:

converting the analog input signal to a series of pulses;

alternately blocking and passing the pulses at a first predetermined control rate;

providing a high resolution binary coefficient from a memory;

multiply the series of pulses by the high resolution binary coefficient; and accumulating the multiplied pulses for generating a series of products.

17. The method according to claim 16 wherein the steps of multiply and accumulating the series of pulses further includes the steps of:

applying the binary coefficient to a series of switches at a second predetermined control rate;

enabling each switch when it receives a binary coefficient;

transmitting each of the series of pulses into registers that are associated with the enabled switches; and accumulating each of the transmitted pulses by adding the binary coefficient when a sign bit is positive, and by subtracting the binary coefficient when the sign bit is negative, wherein the accumulated pulses define the digital output signal.

18. The method according to claim 16 wherein the step of converting the analog input signal to a series of pulses includes using a voltage controlled oscillator.

19. The method according to claim 18 wherein the voltage controlled oscillator includes a superconducting quantum interface device including multiple Josephson Junctions.

20. The method according to claim 16 wherein the step of converting the analog input signal to a series of pulses includes converting the analog input signal to a series of pulses having a higher frequency than the analog signal.

21. The method according to claim 16 wherein the step of alternately blocking and passing the pulses includes a digital gate that receives a gate control signal that is a series of alternating square wave pulses, wherein the series of pulses is passed when the gate control signal pulses are high.

22. The method according to claim 16 wherein the series of pulses has a frequency proportional to the amplitude of the analog signal.

23. The method according to claim 16 wherein the digital output signal is a digital representation of the analog input signal that has been frequency converted and band pass filtered.

* * * * *